(12) United States Patent
Takalo et al.

(10) Patent No.: US 7,151,919 B2
(45) Date of Patent: Dec. 19, 2006

(54) METHOD FOR FORMING AN INTERMEDIATE FREQUENCY SIGNAL IN A MIXER, AND A MIXER

(75) Inventors: Tomi-Pekka Takalo, Tampere (FI); Ari Viljanen, Riihimäki (FI)

(73) Assignee: Nokia Corporation, Espoo (FI)

( * ) Notice: Subject to any disclaimer, the term of this patent is extended or adjusted under 35 U.S.C. 154(b) by 871 days.

(21) Appl. No.: 09/815,035

(22) Filed: Mar. 22, 2001

(65) Prior Publication Data

US 2001/0024450 A1   Sep. 27, 2001

(30) Foreign Application Priority Data

Mar. 24, 2000   (FI) ................................. 20000696

(51) Int. Cl.
*H04B 1/40*   (2006.01)

(52) U.S. Cl. ....................... 455/323; 455/324; 455/326

(58) Field of Classification Search ................ 455/323, 455/326, 324, 333, 302, 304, 285; 375/324, 375/330, 332
See application file for complete search history.

(56) References Cited

U.S. PATENT DOCUMENTS

| | | | | |
|---|---|---|---|---|
| 3,575,660 | A * | 4/1971 | Jorgensen | 455/302 |
| 5,136,254 | A | 8/1992 | Kuwahara | 329/318 |
| 5,140,198 | A * | 8/1992 | Atherly et al. | 327/113 |
| 5,303,417 | A * | 4/1994 | Laws | 455/314 |
| 5,307,021 | A | 4/1994 | Ishizeki | 329/308 |
| 5,475,327 | A | 12/1995 | Wu et al. | 327/308 |
| 5,559,457 | A * | 9/1996 | Uda et al. | 327/116 |
| 5,859,559 | A * | 1/1999 | Hong et al. | 327/359 |
| 5,901,349 | A * | 5/1999 | Guegnaud et al. | 455/302 |
| 5,949,267 | A * | 9/1999 | Rapeli | 327/238 |
| 5,950,119 | A * | 9/1999 | McGeehan et al. | 455/302 |
| 6,144,845 | A * | 11/2000 | Durec | 455/285 |
| 6,226,509 | B1 * | 5/2001 | Mole et al. | 455/302 |
| 6,324,388 | B1 * | 11/2001 | Souetinov | 455/302 |
| 6,472,925 | B1 | 10/2002 | Komurasaki et al. | 327/361 |
| 6,496,545 | B1 * | 12/2002 | Liu | 375/301 |
| 6,597,899 | B1 * | 7/2003 | Souetinov et al. | 455/323 |
| 6,642,787 | B1 * | 11/2003 | Souetinov et al. | 330/252 |

FOREIGN PATENT DOCUMENTS

| | | |
|---|---|---|
| EP | 0774832 A1 | 5/1997 |
| EP | 0849873 A1 | 6/1998 |
| EP | 0961398 A1 | 12/1999 |
| WO | WO 95/20284 | 7/1995 |

OTHER PUBLICATIONS

Japanese Patent Document No. JP8032353—English Translation of the Abstract.
"A 5.1-5.8GHz Low-Power Image-Reject Downconverter in SiGe Technology"; Long et al.; 1999 IEEE; pp. 67-70.

* cited by examiner

*Primary Examiner*—Edward F. Urban
*Assistant Examiner*—Blane J. Jackson
(74) *Attorney, Agent, or Firm*—Perman & Green, LLP.

(57) ABSTRACT

The invention relates to a method for forming at least two intermediate frequency signals with different phases in a mixer (1), to which a first signal (RF) and a second signal (LO) are conducted. According to the method, the first intermediate frequency signal is formed by shifting the phase of the first signal (RF) and by mixing the phase-shifted first signal (RF) and the second signal (LO). The second intermediate frequency signal is formed by mixing the first signal (RF) and the second signal (LO). The phase shift of the first signal (RF) is performed in the mixer (1).

19 Claims, 5 Drawing Sheets

METHOD FOR FORMING AN INTERMEDIATE FREQUENCY SIGNAL IN A MIXER, AND A MIXER

BACKGROUND OF THE INVENTION

1. Field of the Invention

The present invention relates to a method for forming two intermediate frequency signals in different phases in a mixer, to which a first and a second signal are conducted, a first intermediate frequency signal is formed by shifting the phase of the first signal and by mixing the phase-shifted first signal and the second signal, and a second intermediate frequency signal is formed by mixing the first and the second signal. The invention also relates to a mixer, which comprises at least means for conducting the first signal to the mixer, means for conducting the second signal to the mixer, means for forming a first intermediate frequency signal of the first signal, the phase of which has been shifted, and the second signal, and means for forming a second intermediate frequency signal of the first and the second signal. The invention also relates to a receiver, which comprises means for receiving the first signal, which has been modulated in the transmission step, means for forming a second signal, a mixer, means for conducting the first signal to the mixer, means for conducting the second signal to the mixer, means for forming a first intermediate frequency signal of the first signal, the phase of which has been shifted, and the second signal, and means for forming a second intermediate frequency signal of the first and the second signal.

2. Brief Description of Related Invention

In some prior art receivers intended for the reception of radio signals, the received high-frequency radio signal is converted to one or more intermediate frequencies before the information transmitted in the signal is separated from it. Each intermediate frequency is typically lower than the received radio frequency signal. Conversion to the intermediate frequency is generally performed in a mixer, where a mixing frequency generated preferably by a local oscillator, also called a local oscillator signal, is mixed in the receiver with the radio frequency signal. The mixing result provides two signals in the output of the mixer, wherein the frequency of the first signal is the difference between the frequency of the received radio signal and the local oscillator frequency, and the frequency of the second signal is the sum or the frequency of the received radio signal and the local oscillator frequency. The required intermediate frequency signal, typically the difference signal mentioned above, can be separated from these signals by conducting the output signal of the mixer to the band-pass filter. The passband of this band-pass filter has been set so that the desired frequency range passes the band-pass filter essentially unattenuated. Other frequencies, such as the above mentioned sum signal, cannot pass this band-pass filter in any significant amount. A solution like this operates satisfactorily when the intermediate frequency used is relatively high in comparison to the frequency range of the signal to be separated. In audio applications, such as broadcast receivers, the frequency range of the signal to be separated is in the range 20 Hz–20 kHz. In mobile stations, this frequency range may be somewhat smaller, e.g. 300 Hz–4 kHz, while the sound quality is still good enough for transmitting speech.

In broadcast receivers, the intermediate frequency is typically set at about 10.7 MHz in FM applications and at about 455 kHz in AM applications. Recently, however, there has been a tendency especially in portable devices, such as mobile stations, to reduce the size and power consumption of the devices. This has been implemented by increasing the degree of integration of the devices, whereby high frequency and intermediate frequency circuits, for instance, have been placed on an integrated circuit. However, this sets limitations to the implementation of intermediate frequency stages, for instance. The degree of integration can be increased in a radio receiver, if the receiver is implemented by using direct conversion, in which case no intermediate frequency stages are needed, or so that the intermediate frequency used is as low as possible due to interference and other such factors (low-IF).

The implementation of a direct conversion receiver is relatively simple, but the problem is the control of DC offset in the separated signal. On the other hand, the use of a low intermediate frequency makes the attenuation of so-called image frequency signals more difficult. Image frequency signals consist of other radio signals, which are strong and close to the frequency being listened to. These radio signals reach the mixer of the receiver relatively unattenuated, and when mixed with the local oscillator signal, the signals formed as the mixing result are in a frequency range, which is at least partly within the frequency range of the intermediate frequency signals formed in the reception of the desired radio signal, or close to it. When a relatively high intermediate frequency is used, the image frequency signals can be attenuated by using an image frequency filter, such as a band-stop filter tuned to a suitable frequency. On the other hand, when low intermediate frequencies are used, it is not possible in practice to separate the image frequency signals from the desired signal in the band-pass filter, because its Q value should be unrealistically high in order to operate efficiently enough. When the band (BW) of the band-pass filter is wider than the intermediate frequency, the image frequency cannot be separated by filtering. For example, if the band of the band-pass filter is about 78 MHz and the intermediate frequency is about 3 MHz, it is not possible in practice to separate the image frequency by filtering.

There are some prior art solutions for intensifying the image frequency attenuation in receiver applications, in which a relatively low intermediate frequency, e.g. in the range of some tens of kilohertz, is used. Examples of these solutions that may be mentioned in this connection are the Weaver and Hartley topologies. The idea in these is to attenuate the image frequencies in connection with the mixer, and thus a separate image frequency filter is not needed. A prior art Hartley mixer is shown in FIG. 1. It comprises, among other things, two mixer blocks, whereby the received radio frequency signal RF is mixed in the first mixer block 2 with a local oscillator signal LO, on which a 90° phase shift has been performed in the first phase shift block 4 and which has been amplified in the first buffer stage 6. In the second mixer block 3, the received radio frequency signal is mixed without phase shift with the local oscillator signal LO, which has been amplified in the second buffer stage 7. In addition, a 90° phase shift is performed on the mixing result of the second mixer block in the second phase shift block 5. There are two intermediate frequency signals in the output of the mixer, and these are summed in the adder 8 located after the mixers. It can be proved mathematically that the phase shift has a different effect on the desired frequency than the image frequency, and thus in an ideal case the desired signal has the same phase in summing and is sustained, whereas the image frequency has the opposite phase and is eliminated in a Hartley mixer. In addition, the intermediate frequency signal is demodulated in order to detect the transmitted information.

A prior art Hilbert mixer is shown in FIG. 2. The main difference between this Hilbert mixer and the above described Hartley mixer is the fact that phase shift is not performed on the local oscillator signal before conducting it to the second mixer. Instead, phase shift is performed on the received radio frequency signal in the first phase shift block 4 before conducting the signal to the second mixer block of the mixer. There are two intermediate frequency signals in the output of the mixer, and these signals are summed in the adder 8 located after the mixers. The fact that the phase shift has a different effect on the desired frequency than on the image frequency is also utilized in this mixer solution, and thus in an ideal case the desired signal has the same phase in summing and is sustained, whereas the image frequency has the opposite phase and is eliminated in a Hilbert mixer. In addition, the intermediate frequency signal is demodulated in order to detect the transmitted information.

However, a drawback of the mixer solutions described above is the fact that in order to accomplish sufficiently reliable operation of the mixers, the components used in the mixers must be accurately measured and matched to each other. Thus the manufacturing tolerances of the components must be very small, and this causes considerable difficulties in practical applications and increases the price of the receivers.

It is an object of the present invention to accomplish a method for converting a radio signal to an intermediate frequency in a mixer, and a mixer and a receiver. The invention is based on the idea that phase shift is performed on the received radio frequency signal in the mixer and not before it. The method according to the present invention is characterized in that the phase shift of the first signal is performed in the mixer. The mixer according to the present invention is characterized in that the mixer also comprises at least means for performing phase shift on the first signal. In addition, the receiver according to the present invention is characterized in that the mixer also comprises at least means for performing phase shift on the first signal.

SUMMARY OF THE INVENTION

This invention provides considerable advantages as compared to the prior art methods, mixers and receivers. Because the phase shift of the received radio frequency signal is performed in the mixer and not before it, in the input line of the mixer to which the radio frequency signal is conducted, generally as amplified in a high-frequency amplifier, it is possible to increase the impedance level substantially higher than in the prior art solutions, in which the phase shift is performed before the mixer. The high frequency amplifier can then be somewhat simplified, and two separate buffer stages are not needed to feed the local oscillator signal to the mixer, but one buffer stage is enough, because the local oscillator signal is fed to both mixers in the same phase. When a mixer according to the invention is used, the power consumption of the receiver can also be reduced as compared to the prior art receivers. When a mixer according to the invention is used, at least one phase shift block can be implemented in connection with the mixer, and therefore the size of the mixer can be reduced especially in integrated circuit applications. When the method according to the invention is applied, the degree of integration of the receiver can be increased and the size of the receiver thus reduced, and therefore the receiver can be advantageously used in various portable data transfer applications.

BRIEF DESCRIPTION OF THE DRAWINGS

In the following, the invention will be described in more detail with reference to the accompanying drawings, in which.

DETAILED DESCRIPTION OF THE PREFERRED EMBODIMENT

Figure 4:
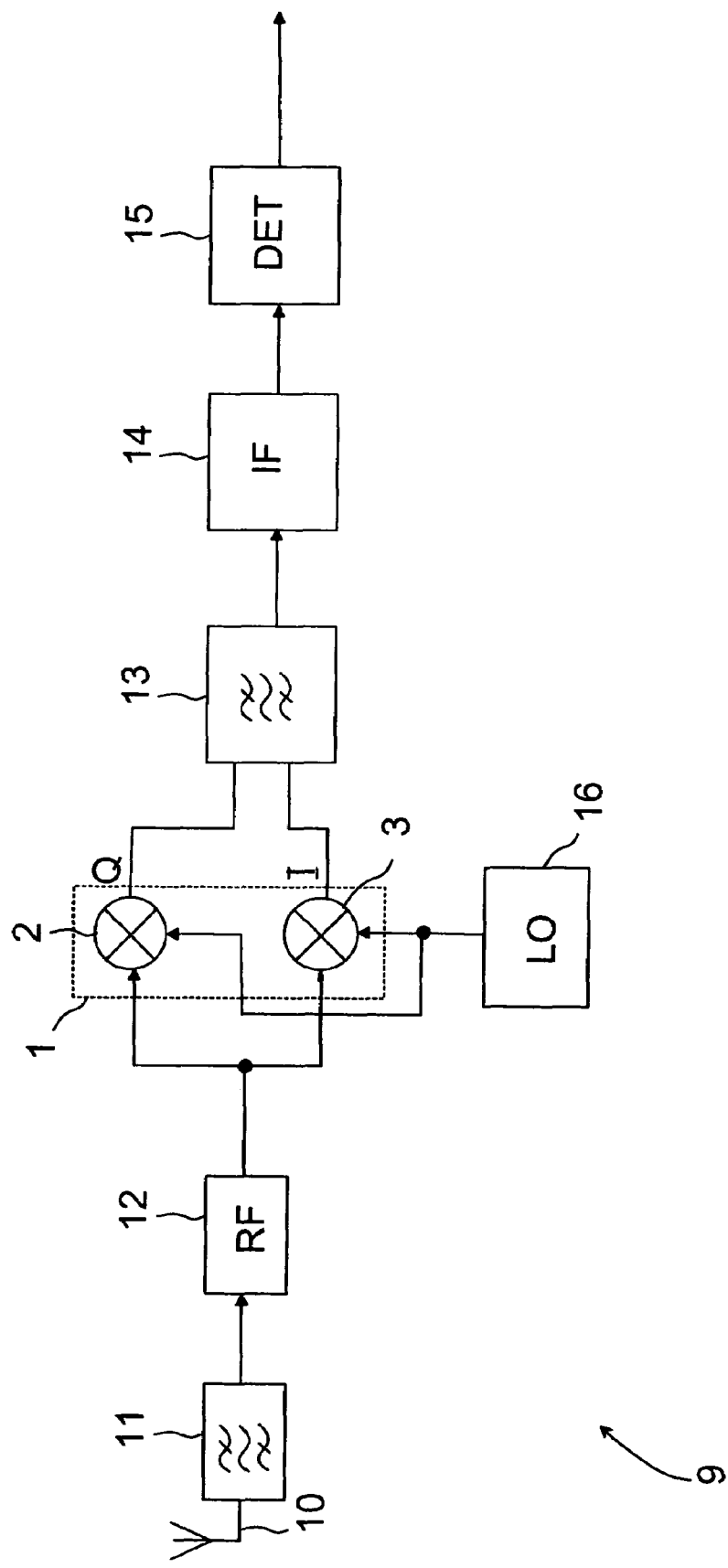
FIG. 4 is a simplified block diagram of a receiver according to a preferred embodiment of the invention.

FIG. 4 shows a receiver 9 intended for the reception of radio frequency signals. The receiver preferably comprises an antenna 10, a high frequency filter 11, a high frequency amplifier 12, a mixer 1, an intermediate frequency filter 13, an intermediate frequency amplifier 14, a detector 15 and a local oscillator 16. The receiver 9 may be e.g. the receiver of a mobile station 17 (FIG. 5), a broadcast receiver, a television receiver or a modem receiver. Radio frequency signals, which are received via the antenna, are conducted to the high frequency filter 11, in which the frequencies outside the desired reception frequency band are eliminated. Then the radio frequency signal received on the reception frequency band is conducted to the high frequency amplifier 12 for amplification. The carrier frequency of the radio frequency signal received on the desired reception frequency band is denoted by $f_c$ in this specification. On the basis of the strength of the received signal, the amplification of the high frequency amplifier 12 is adjusted according to need. From the high frequency amplifier 12, the radio frequency signal is conducted to the mixer 1, in which the received radio frequency signal is either converted to an intermediate frequency, like in the example of FIG. 4, or directly to the baseband in a direct conversion receiver (not shown). A local oscillator signal LO generated by the local oscillator 15, the frequency of which is denoted $f_{LO}$, is also conducted to the mixer 1. From the mixing results produced by the mixer, the desired intermediate frequency signal is separated from other mixing results in an intermediate frequency filter 13. The intermediate frequency signal is amplified in the intermediate frequency amplifier 14 and detected in the detector 15. The receiver 9 shown in FIG. 4 is suitable for the reception of a signal modulated in two phases, such as a coherent signal, in which case signals in two different phases, I (In-phase), Q (Quadrature), are dealt with in the intermediate frequency and detection phases. Typically, there is a phase difference of about 90° between these signals.

In the GSM-1800 system, for example, the carrier wave frequency is approximately 1800 MHz, depending on the channel frequency received at each time. The local oscillator frequency is then set at the distance of an intermediate frequency from this channel frequency, and thus the intermediate frequency is essentially the same in each channel frequency, which is known as such. When a mixer according to the invention is used, the intermediate frequency may be substantially lower than in the prior art solutions, which is due to the fact that the image frequency attenuation can be made better, among other things.

The radio frequency signal to be received has been modulated in the transmission step by phase or frequency modulation, but it is clear that other modulation methods can also be used in connection with this invention.

Figure 1:
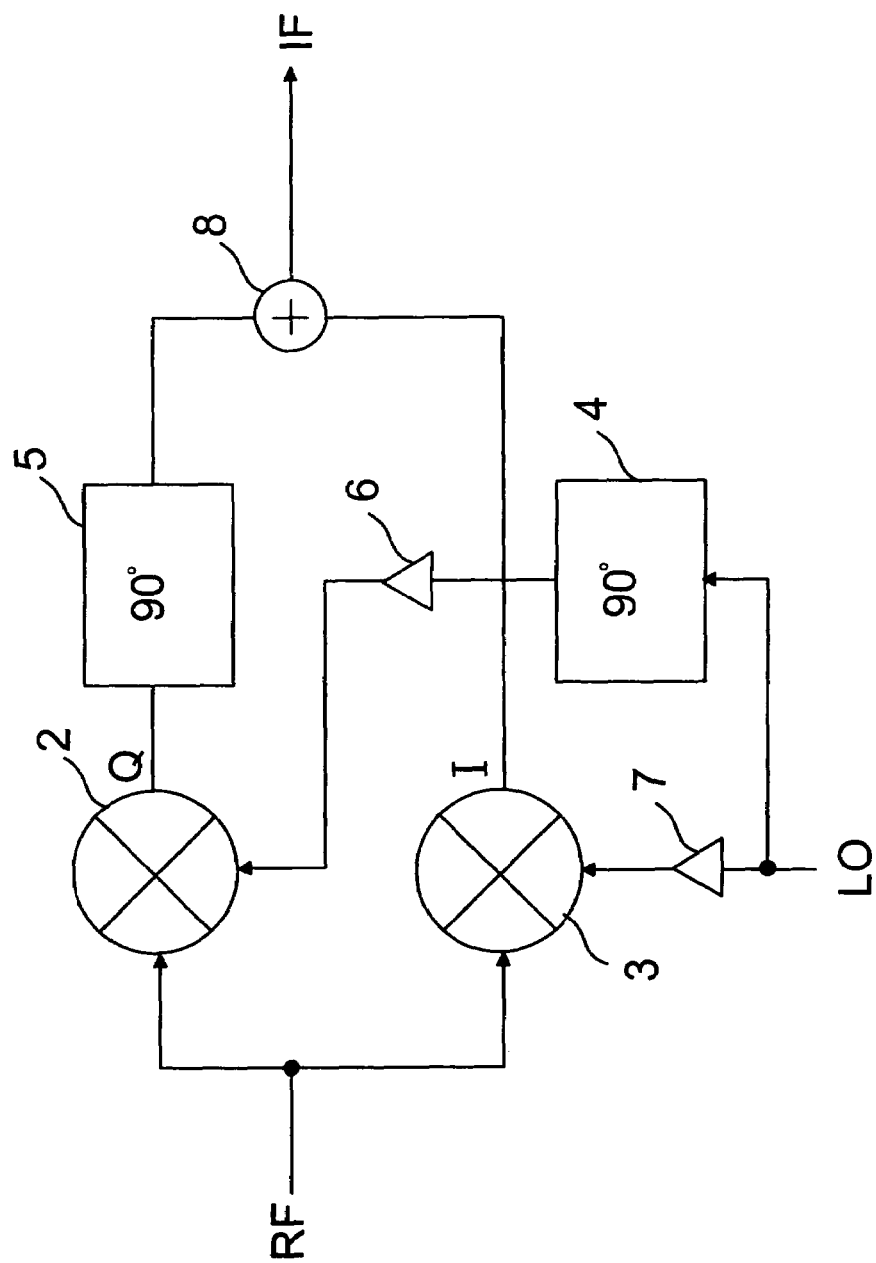
FIG. 1 is a schematic block diagram of a prior art Hartley mixer.
Figure 2:
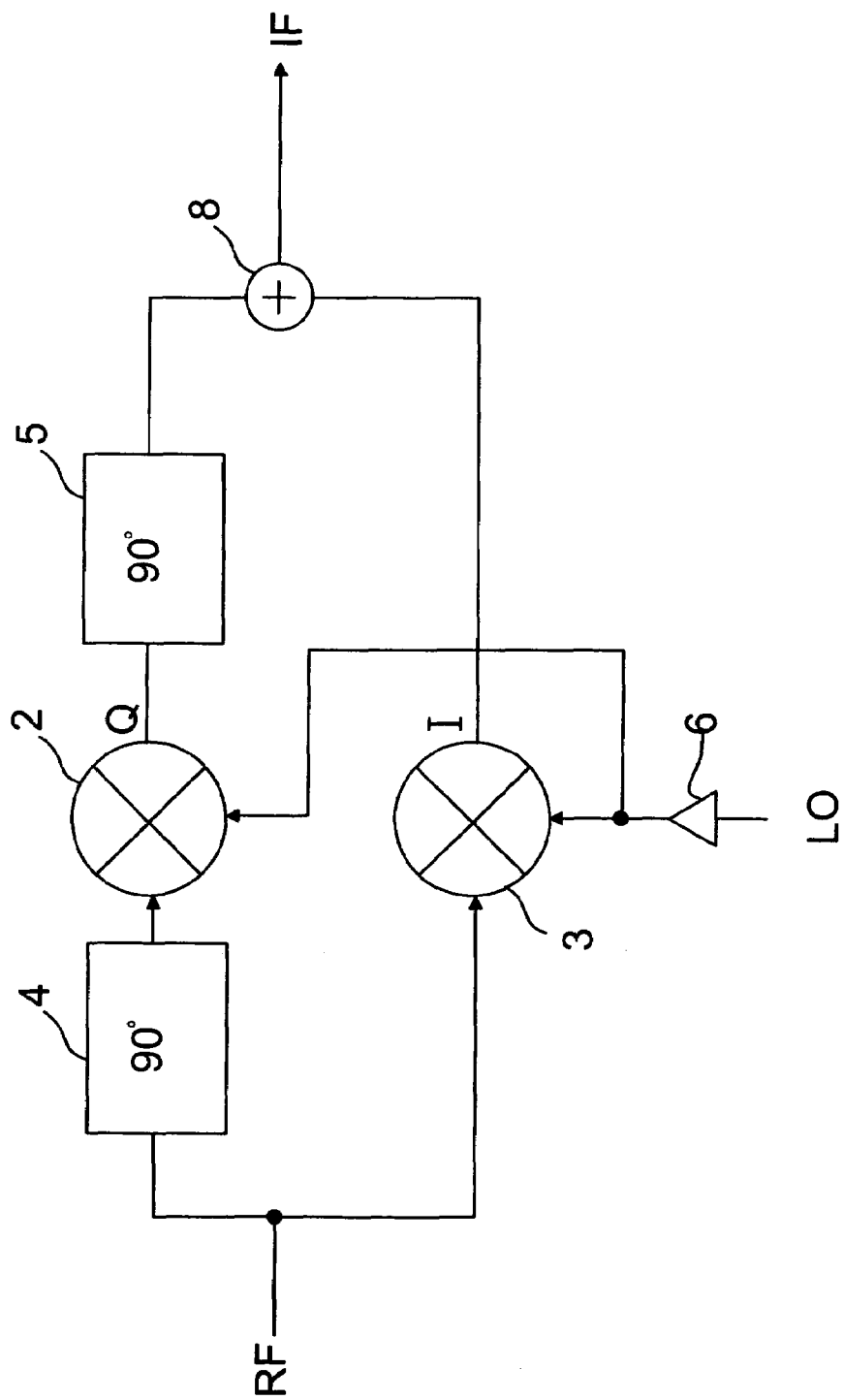
FIG. 2 is a schematic block diagram of a prior art Hilbert mixer.
Figure 3:
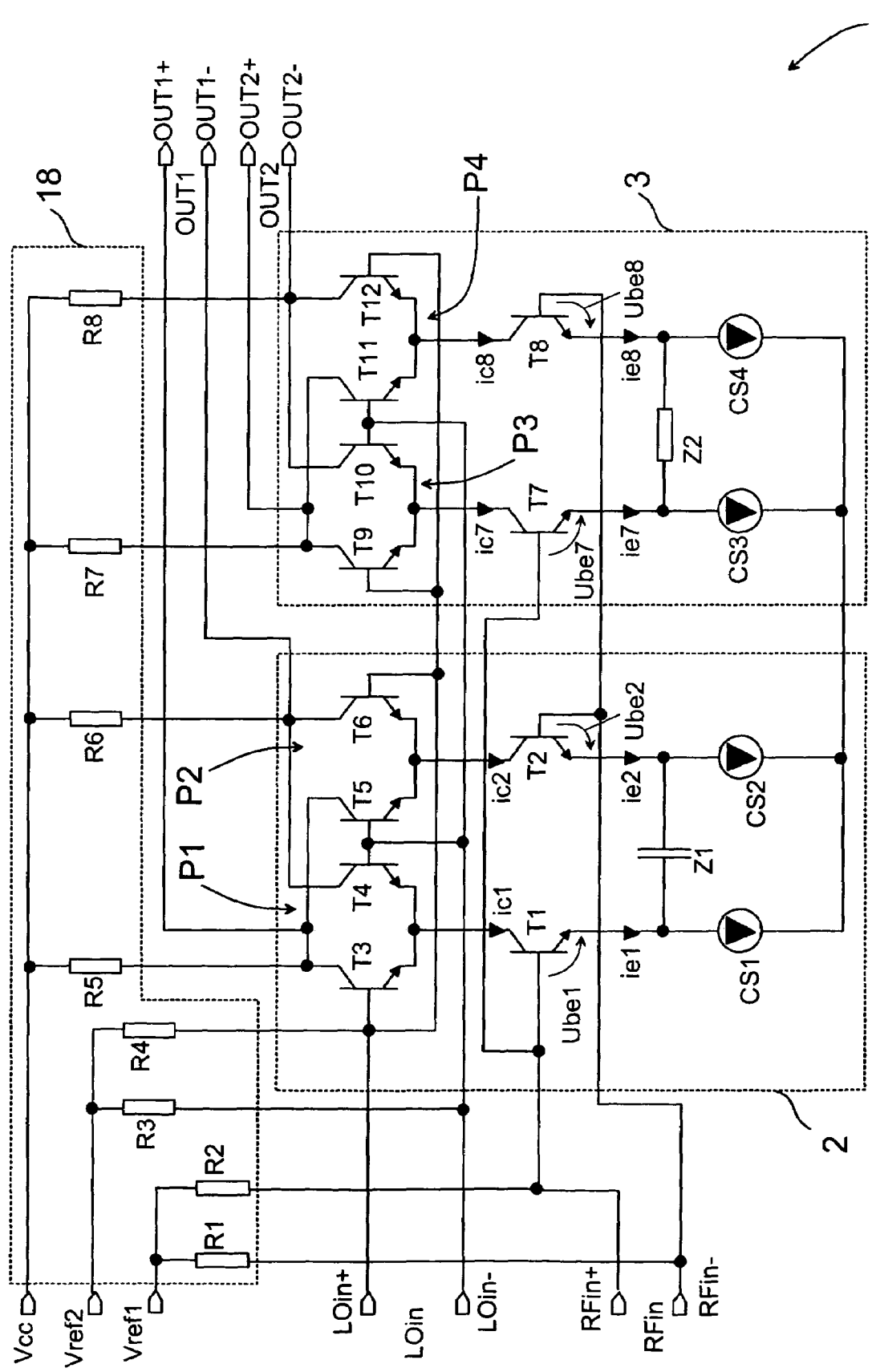
FIG. 3 is a circuit diagram of a mixer according to a preferred embodiment of the invention.

The operation of a method according to a preferred embodiment of the invention in a mixer 1 according to a preferred embodiment of the invention shown in FIG. 3 will be described in the following. The mixer 1 operates on the principle of a double-balanced Hilbert mixer. The mixer 1 comprises at least a first mixer block 2 and a second mixer block 3 for mixing the local oscillator signal LO and the received radio frequency signal RF and for forming a double-phase (I/Q) intermediate frequency signal IF, and a power supply block 18 for feeding the voltages and currents needed in the operation of the mixer 1 to the mixer 1. In addition, the mixer 1 comprises a first differential input for conducting the received radio frequency signal RF to the mixer 1, and a second differential input LO in for conducting the local oscillator signal LO to the mixer 1.

The first mixer block 2 comprises transistors T1, T2, T3, T4, T5, T6, power supplies CS1, CS2, biasing resistors R1, R2, R3, R4, and a first impedance Z1, such as a capacitor. The transistors T1, T2 are preferably NPN-type bipolar transistors, each of which has at least one control element, such as a base, a first output element, such as an emitter, and a second output element, such as a collector. Later in this specification, mainly NPN bipolar transistors will be used as examples of other transistors as well, and therefore the first control element will be called base, the first output element will be called emitter, and the second output element will be called collector. However, it is clear that said control element, first output element and second output element may also be of other types than those mentioned here, if other than bipolar transistors, such as FET transistors, are used.

The emitters E1, E2 of the transistors T1, T2 are coupled together by the first impedance Z1. In an ideal situation, a 90° phase shift is achieved in the first impedance Z1, but due to the non-ideal characteristics of the first impedance Z1, in particular, the phase shift is not necessarily exactly 90° in practical applications. Nevertheless, this does not have a significant effect on the operation of the mixer 1 in practice. The first impedance is then a reactive impedance, preferably mainly a capacitive impedance, such as a capacitor, but in some applications a mainly inductive impedance, such as a coil or choke can be used. In addition, he emitters of the transistors T1, T2 are coupled via the power supplies CS1, CS2 to the common ground potential GND. The bases of the transistors T1 and T2 constitute the first differential input RFin preferably so that the base of the transistor T1 acts as the positive pole RFin+ of the first differential input, and the base of the transistor T2 acts as the negative pole RFin− of the first differential input. The first differential input RFin is DC-coupled to the resistor R1 and the resistor R2. These resistors R1, R2 are preferably coupled to a first reference voltage Vref1 for forming a biasing voltage to the bases of the transistors T1, T2, which is known as such.

The emitters of the transistors T3, T4 are DC-coupled to each other, whereby the transistors T3, T4 form a first differential pair P1. In addition, these emitters are DC-coupled to the collector C1 of the transistor T1. Similarly, the transistors T5, T6 form a second differential pair P2. The DC-coupled emitters of this second differential pair are DC-coupled to the collector of the transistor T2. The bases of the transistors T3 and T4 are DC-coupled to each other, and thus they form the positive pole LOin+ of the second differential input. Similarly, the bases of the transistors T5 and T6 are DC-coupled to each other, and thus they form the negative pole LOin− of the second differential input. The second differential input LOin is DC-coupled to a biasing resistor R3 and a biasing resistor R4, which are preferably coupled to the second reference voltage Vref2 for forming a biasing voltage to the bases of the transistors T3, T4, T5, T6.

The first and the second differential pair P1 and P2 are DC-coupled crosswise for the part of the collectors so that the collector of the transistor T3 of the first differential pair P1 is DC-coupled to the collector of the transistor T5 of the second differential pair P2, whereby these collectors form the positive output pole OUT1+ of the differential output OUT1 of the first mixer block 2. Correspondingly, the collector of the transistor T4 of the first differential pair P1 is DC-coupled to the collector of the transistor T6 of the second differential pair P2, whereby these collectors form the negative output pole OUT1− of the differential output OUT1 of the first mixer block 2. In addition, the positive output pole OUT1+ of the differential output OUT1 is coupled to the resistance R5 of the power supply block 18, and the negative output pole OUT1− of the differential output OUT1 is coupled to the resistance R6 of the power supply block 18.

The coupling of the second mixer block 3 is largely similar to that of the first mixer block 2. This second mixer block 3 comprises transistors T7, T8, T9, T10, T11, T12, power sources CS3, CS4, biasing resistors R7, R8, R9, R10 and a second impedance Z2, such as a resistor. The transistors T7, T8, T9, T10, T11, T12 are also preferably NPN-type bipolar transistors.

The emitters E7, E8 of the transistors T7, T8 are coupled to each other by a second impedance Z2, which is preferably a mainly resistive impedance. In an ideal situation, the phase of the signal does not change in the second impedance Z2, but in practice, especially due to conductor capacitances and the non-ideal characteristics of the second impedance Z2, some phase shift may occur. Nevertheless, this does not have a significant effect on the operation of the mixer 1 in practice. In addition, he emitters of the transistors T7, T8 are coupled via the power supplies to the common ground potential GND. The bases of the transistors T7 and T8 are DC-coupled to the first differential input RFin of the mixer preferably so that the base of the transistor T7 is coupled to the positive pole RFin+ of the first differential input, and the base of the transistor T8 is coupled to the negative pole RFin− of the first differential input. The resistors R1, R2 act as biasing resistors for forming a biasing voltage to the bases of the transistors T7, T8 as well.

The emitters of the transistors T9, T10 are DC-coupled to each other, whereby the transistors T9, T10 form a third differential pair P3. In addition, these emitters are DC-coupled to the collector of the transistor T7. Correspondingly, the transistors T11, T12 form a fourth differential pair P4. The DC-coupled emitters of this fourth differential pair P4 are DC-coupled to the collector of the transistor T8. The bases of the transistors T9 and T10 are DC-coupled preferably to the positive pole LOin− of the second differential input, and the bases of the transistors T11 and T12 are likewise DC-coupled to each other and to the negative pole LOin− of the second differential input. The biasing resistors R3 and R4 are used to form a biasing voltage to the bases of the transistors T9, T10, T11, T12 as well.

The third and the fourth differential pair P3 and P4 are DC-coupled crosswise for the part of the collectors so that the collector of the transistor T9 of the third differential pair P3 is DC-coupled to the collector of the transistor T11 of the fourth differential pair P4, whereby these collectors form the positive output pole OUT2+ of the differential output OUT2 of the second mixer block 3. Correspondingly, the collector of the transistor T10 of the third differential pair P3 is DC-coupled to the collector of the transistor T12 of the fourth differential pair P4, whereby these collectors form the negative output pole OUT2− of the differential output OUT2 of the second mixer block 3. In addition, the positive output pole OUT2+ of the differential output OUT2 is coupled to the resistance R7 of the power supply block 18, and the negative output pole OUT2− of the differential output OUT2 is coupled to the resistance R8 of the power supply block 18.

The operation of a mixer 1 according to a preferred embodiment of the invention according to FIG. 3 will be described in the following. The radio frequency signal RF to be converted to an intermediate frequency, which has been amplified in the high frequency amplifier 12 when required, is conducted to the first differential input RFin of the mixer 1, for example, and the local oscillator signal LO is then conducted to the second differential input LOin. In the first mixer block 2, the radio frequency signal is conducted to the base of the transistors T1, T2, whereby the signal is amplified in the transistors T1, T2. As a result of this, a collector current $i_{c1}$, $i_{c2}$ proportional to the signal voltage $u_{be1}$, $u_{be2}$ to be conducted to the base is produced. This collector current is carried to the emitter of the transistors, in which the current $i_{e1}$, $i_{e2}$ is then a sum of the base current and the collector current. However, the first impedance Z1 causes a change of about 90° in the phase difference of the collector current $i_{c1}$, $i_{c2}$ and the base voltage $u_{be1}$, $u_{be2}$ of the transistors.

The local oscillator signal LO is conducted to the second differential input LOin. The transistor T1 operates as a power source proportional to the radio frequency signal to the first differential pair P1. Similarly, the transistor T2 operates as a power source proportional to the radio frequency signal to the second differential pair P2. Then each differential pair P1, P2 forms a current strength to the collector, which is influenced both by the radio frequency signal and the local oscillator signal. In the load resistors R5, R6 coupled to the collectors, the collector current is changed to a voltage. The sum $f_{RF}+f_{LO}$ and difference $f_{RF}-f_{LO}$ of the radio frequency signal and the local oscillator signal that have been formed as the mixing result can then be detected in the differential output OUT1 of the first mixer block 2. In addition, harmonic frequencies, such as $f_{RF}+2f_{LO}$, $f_{RF}+3f_{LO}$, ..., $2f_{RF}+f_{LO}$, $3f_{RF}+f_{LO}$, etc. may be produced as the mixing result. The signal received from the differential output of the first mixer block 2 is conducted to the intermediate frequency filter 13, in which unwanted signals are attenuated (filtered) from the signal, and the wanted intermediate frequency signal (typically the difference of the radio frequency signal and the local oscillator signal) is conducted to the detector 15 (FIG. 4), in which the Q component of the transmitted information is detected.

In the second mixer block 3, the radio frequency signal is conducted to the base of the transistors T7, T8, whereby the signal is amplified in the transistors T7, T8. As a result of this, a collector current $i_{c7}$, $i_{c8}$ proportional to the signal voltage $u_{be7}$, $u_{be8}$ to be conducted to the base is produced. This collector current is carried to the emitter of the transistors T7, T8, in which the current $i_{e7}$, $i_{e8}$ is then a sum of the base current and the collector current. The difference here as compared to the operation of the first mixer block is mainly the fact that the second impedance Z2 does not significantly change the phase difference of the collector current $i_{c7}$, $i_{c8}$ and the base voltage $u_{be7}$, $u_{be8}$ of the transistors.

The transistor T7 operates as a power source proportional to the radio frequency signal to the third differential pair P3. Similarly, the transistor T8 operates as a power source proportional to the radio frequency signal to the fourth differential pair P4. Then each differential pair P3, P4 forms a current strength to the collector, which is influenced both by the radio frequency signal and the local oscillator signal. In the load resistors R7, R8 coupled to the collectors, the collector current is changed to a voltage. The sum and difference of the radio frequency signal and the local oscillator signal that have been formed as the mixing result can then be detected in the differential output OUT2 of the second mixer block 3. However, in this case the signals have a phase difference of about 90° compared to the signals of the first differential output. The signal received from the differential output OUT2 of the second mixer block 3 is conducted to the intermediate frequency filter 13, in which unwanted signals are attenuated (filtered) from the signal, and the wanted intermediate frequency signal is conducted to the detector 15, in which the I component of the transmitted information is detected.

In the prior art solutions, in which the phase shift has been implemented in the data transfer link of the radio signal before the mixer, it causes loading of the signal path, which depends on the impedances used to implement the phase shift and their mutual couplings. When a solution according to the invention is used, this loading can be substantially reduced, because the phase shift components have been placed in the emitter branch of the transistors T1, T2. Thus the impedances do not influence the impedance of the differential input RFin directly, but as multiplied by the amplification of the transistors T1, T2. The amplification factor is typically in the range of some tens to some hundreds, and thus the loading effect may be reduced to less than one hundredth of the prior art solutions, in which the phase shift placed in front of the mixer generally attenuates the signal and thus increases the noise/noise performance of the receiver. The reduction of the loading effect reduces the loading of the output of the high frequency amplifier 12 and the power consumption of the receiver. In addition, the mixer 1 can be integrated into a smaller space, because fewer components are needed in the implementation of the mixer and power consumption is reduced.

In the mixer 1, operationally similar transistors, such as the transistors T1, T2, T7 and T8, and correspondingly the transistors T3–T6, T9–T12 of the differential pairs P1–P4 have essentially similar electric properties. When a mixer 1 according to the invention is implemented on an integrated circuit (not shown), these properties can be made similar with a sufficient accuracy by forming the transistors geometrically essentially similar and by placing them on the same substrate. The resistance values of the load resistors R5–R8 should also be as similar as possible.

Figure 5:
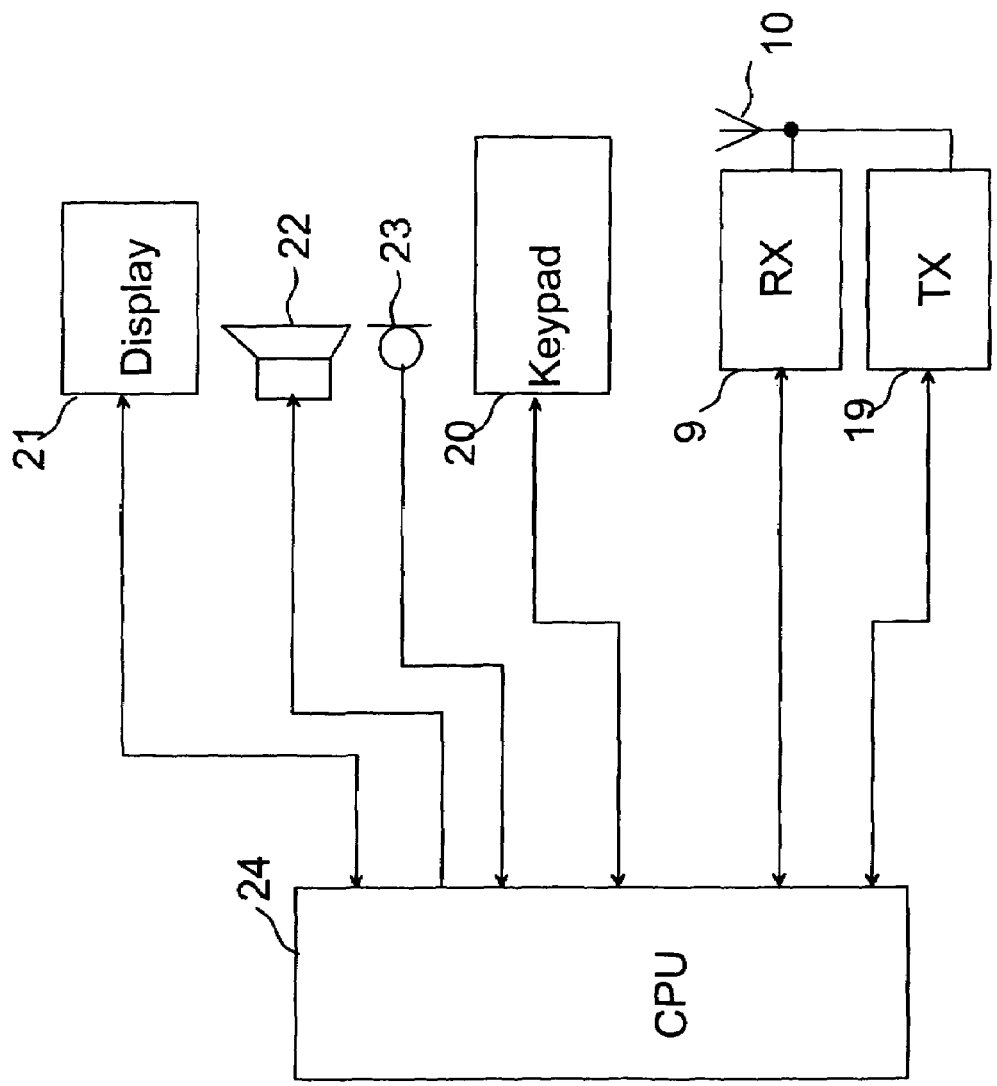
FIG. 5 is a simplified block diagram of a mobile station, in which a mixer according to a preferred embodiment of the invention is used.

FIG. 5 shows yet another mobile station 17, in which a mixer 1 according to a preferred embodiment of the invention has been used. The mobile station 17 comprises, for instance, an antenna 10, a receiver 9, a transmitter 19, a keypad 20, a display 21, an earphone 22 and a microphone 23, and one ore more processors 24. The operation of a mobile station 17 is known as such to a person skilled in the art, and on the basis of the above description of the operation of a mixer 1 according to a preferred embodiment of the invention, a person skilled in the art can apply the invention in connection with a mobile station 17.

It is clear that the present invention is not limited to the above described embodiments only, but its details can be modified without departing from the scope defined by the attached claims.

The invention claimed is:

1. A method for forming at least two intermediate frequency signals in different phases in a mixer, comprising a first mixer block and a second mixer block, to which a first signal (RF) and a second signal (LO) are conducted, a first intermediate frequency signal is formed by shifting the phase of the first signal (RF) and by mixing the phase-shifted first signal and the second signal (LO), and a second intermediate frequency signal is formed by mixing said first signal (RF) and said second signal (LO), wherein the phase shift of the first signal is performed in a first mixer block of said mixer and substantially no phase shift occurs in the second mixer block.

2. A method according to claim 1, in which a radio frequency signal is received, the signal is modulated in the transmission step with at least two modulation signals in different phases, and a local oscillator signal is formed, characterized in that the first signal (RF) is said received radio frequency signal, and that the second signal (LO) is said local oscillator signal, wherein said first intermediate frequency signal comprises a first modulation signal, and said second intermediate frequency signal comprises a second modulation signal.

3. A method according to claim 1, in which a radio frequency signal is received, the signal is modulated in the transmission step with at least one modulation signal, and a local oscillator signal is formed, characterized in that the first signal is said received radio frequency signal, and that the second signal (LO) is said local oscillator signal, wherein said intermediate frequency signal comprises two modulation signals formed of the signal to be received, and there is a phase difference between the modulation signals.

4. A method according to claim 1, in which a reception frequency for receiving the radio frequency signal is selected, the radio frequency signal is received at the selected reception frequency, the received radio frequency signal is converted to at least one intermediate frequency, a signal at the image frequency of the received radio frequency signal is received, the image frequency being a function of the frequency of the received radio frequency signal and the intermediate frequency, and a local oscillator signal is formed, characterized in that the first signal (RF) is said received radio frequency signal, that the second signal (LO) is said local oscillator signal, and that said at least two intermediate frequency signals are summed for attenuating the image frequency signal, whereby a modulation signal essentially similar to the transmitted radio frequency signal is formed as the summing result.

5. A method according to claims 1, characterized in that phase modulation is used in the transmission step for modulating the radio frequency signal to be received.

6. A method according to claim 1, characterized in that frequency modulation is used in the transmission step for modulating the radio frequency signal to be received.

7. A mixer, which comprises at least means (RFin) for conducting the first signal (RF) to the mixer, means (LOin) for conducting the second signal (LO) to the mixer, means for forming a first intermediate signal of the first signal (RF), the phase of which has been shifted, and of the second signal (LO), and means for forming a second intermediate frequency signal of the first and second signal (LO), wherein the mixer also comprises at least means (Z1) for performing a phase shift on said first signal in a first mixing block of the mixer and maintaining a substantially constant phase in a second mixing block of the mixer.

8. A mixer (1) according to claim 7, wherein
the means (RFin) for conducting the first signal (RF) to the mixer comprise a first pair of transistors (T1, T2), to the bases of which the first signal (RF) is arranged to be conducted,
the means (LOin) for conducting the second signal (LO) to the mixer comprise a first and second differential pair of transistors (P1, P2), to the bases of which the second signal (LO) is arranged to be conducted,
the means (Z1) for performing phase shift on the first signal (RF) comprise a reactive impedance, which is coupled to the emitters (E1, E2) of the first two transistors (T1, T2),
the means (T1–T6, R5, R6) for forming the first intermediate frequency signal of said first signal (RF) comprise said first two transistors (T1, T2), said first and second differential pair of transistors (P1, P2) coupled crosswise, and two resistors (R5, R6), and
the means (T7–T12, R7, R8) for forming the second intermediate frequency signal of the first (RF) and second signal (LO) comprise a second pair of transistors (T7, T8), a third and fourth differential pair of transistors (P3, P4) coupled crosswise, and two resistors (R7, R8).

9. A mixer (1) according to claim 8, characterized in that said reactive impedance is a capacitive impedance, such as a capacitor.

10. A mixer (1) according to claim 8, characterized in that said reactive impedance is an inductive impedance, such as a coil.

11. A mixer (1) according to claim 7, characterized in that said first signal (RF) has been modulated by at least two modulations with different phases.

12. A mixer (1) according to claim 7, characterized in that said first signal (RF) has been modulated by frequency modulation.

13. A receiver, which comprises means for receiving a first signal (RF), which has been modulated in the transmission step, means for forming a second signal (LO), a mixer, means (RFin) for conducting said first signal (RF) to the mixer, means (LOin) for conducting said second signal (LO) to the mixer, means for forming a first intermediate signal of said first signal (RF), the phase of which has been shifted in a first mixing block of the mixer, and of said second signal (LO), and means (T7–T12, R7, R8) for forming a second intermediate frequency signal of said first (RF) and second signal (LO) in a second mixing block of the mixer that does not substantially change a phase difference of the first signal.

14. A receiver (9) according to claim 13, characterized in that it also comprises at least a local oscillator (15) for forming said second signal (LO).

15. A receiver (9) according to claim 13, characterized in that the means (Z1) for performing phase shift comprise a capacitive impedance, such as a capacitor.

16. A receiver (9) according to claim 13, characterized in that the means (Z1) for performing phase shift comprise an inductive impedance, such as a coil.

17. A receiver (9) according to claim 13, characterized in that said first signal (RF) has been modulated by at least two modulations with different phases.

18. A receiver (9) according to claim 13, characterized in that said first signal (RF) has been modulated by frequency modulation.

19. A receiver (9) according to claim 13, characterized in that it is the receiver of a mobile station (17).

* * * * *